United States Patent
Kim et al.

(10) Patent No.: US 10,476,039 B2
(45) Date of Patent: Nov. 12, 2019

(54) DISPLAY DEVICE AND METHOD FOR MANUFACTURING THE SAME

(71) Applicant: LG Display Co., Ltd., Seoul (KR)

(72) Inventors: Eunah Kim, Asan-si (KR); Sangcheon Youn, Seoul (KR); Saemleenuri Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/794,879

(22) Filed: Oct. 26, 2017

(65) Prior Publication Data

US 2018/0123080 A1    May 3, 2018

(30) Foreign Application Priority Data

Oct. 27, 2016    (KR) .................. 10-2016-0141015

(51) Int. Cl.
| | | |
|---|---|---|
| *H01L 51/52* | (2006.01) | |
| *H01L 27/32* | (2006.01) | |
| *G09G 3/3275* | (2016.01) | |
| *H01L 51/00* | (2006.01) | |
| *H01L 51/56* | (2006.01) | |
| *G09G 3/3208* | (2016.01) | |

(52) U.S. Cl.
CPC ......... *H01L 51/529* (2013.01); *G09G 3/3275* (2013.01); *H01L 27/322* (2013.01); *H01L 27/3255* (2013.01); *H01L 27/3262* (2013.01); *H01L 27/3272* (2013.01); *H01L 51/003* (2013.01); *H01L 51/0097* (2013.01); *H01L 51/56* (2013.01); *G09G 3/3208* (2013.01); *G09G 2300/0408* (2013.01); *G09G 2330/045* (2013.01); *G09G 2380/02* (2013.01); *H01L 2227/323* (2013.01); *H01L 2227/326* (2013.01); *H01L 2251/5338* (2013.01); *Y02E 10/549* (2013.01)

(58) Field of Classification Search
None
See application file for complete search history.

(56) References Cited

U.S. PATENT DOCUMENTS

| | | | | |
|---|---|---|---|---|
| 2003/0047280 A1* | 3/2003 | Takayama | ............. | B32B 7/06 156/708 |
| 2003/0189542 A1* | 10/2003 | Lee | ............. | G09G 3/3648 345/93 |
| 2004/0206974 A1* | 10/2004 | Yamazaki | ......... | H01L 29/42384 257/98 |
| 2005/0110132 A1* | 5/2005 | Yokoyama | ........ | H01L 29/78603 257/706 |

(Continued)

FOREIGN PATENT DOCUMENTS

KR    10-2015-0078184 A    7/2015

*Primary Examiner* — Benjamin P Sandvik
*Assistant Examiner* — Herve-Louis Y Assouman
(74) *Attorney, Agent, or Firm* — Polsinelli PC

(57) ABSTRACT

A display device and a method for manufacturing the same capable of preventing a defective drive of a gate-in-panel (GIP) driver by dissipating high heat generated in a large-sized thin film transistor of the GIP driver are disclosed. The display device includes a flexible substrate, a GIP driver and a display unit disposed on the flexible substrate, a protective member disposed under the flexible substrate, and a heat pad disposed between the flexible substrate and the protective member and overlapping the GIP driver.

19 Claims, 18 Drawing Sheets

(56) References Cited

U.S. PATENT DOCUMENTS

| | | | | |
|---|---|---|---|---|
| 2006/0056213 A1* | 3/2006 | Lee | ............... | H01L 23/4334 363/144 |
| 2007/0081344 A1* | 4/2007 | Cappaert | ............... | G02B 6/0085 362/373 |
| 2007/0159078 A1* | 7/2007 | Park | ............... | H01L 51/529 313/504 |
| 2007/0221941 A1* | 9/2007 | Jeong | ............... | G02F 1/133603 257/99 |
| 2010/0156763 A1* | 6/2010 | Lee | ............... | H01L 51/529 345/76 |
| 2010/0163879 A1* | 7/2010 | Jung | ............... | G02F 1/13454 257/59 |
| 2011/0114993 A1* | 5/2011 | Lee | ............... | H01L 51/003 257/100 |
| 2013/0069045 A1* | 3/2013 | Otsuki | ............... | H01L 27/1225 257/40 |
| 2013/0069853 A1* | 3/2013 | Choi | ............... | H01L 27/3276 345/80 |

\* cited by examiner (a)  (b)  (c)

DISPLAY DEVICE AND METHOD FOR MANUFACTURING THE SAME

CROSS REFERENCE TO RELATED APPLICATION

This application claims the priority benefit of Korean Patent Application No. 10-2016-0141015 filed on Oct. 27, 2016, which is incorporated herein by reference in its entirety for all purposes as if fully set forth herein.

BACKGROUND

Field of the Disclosure

The present disclosure relates to a display device, and more particularly, to a display device and a method for manufacturing the same for preventing damage on thin film transistors.

Discussion of the Background

With development of information society, demands for display devices displaying an image are increasing in various ways. In the field of the display devices, a large-sized cathode ray tube (CRT) has been rapidly replaced by a flat panel display (FPD) having advantages of a thin profile, light weight, and a large-sized screen. Examples of the flat panel display include a liquid crystal display (LCD), a plasma display panel (PDP), an organic light emitting diode (OLED) display, and an electrophoresis display (EPD).

An OLED display includes self-emitting elements capable of emitting light by themselves and has advantages of a fast response time, a high emission efficiency, a high luminance, and a wide viewing angle. In particular, the OLED display can be manufactured on a flexible substrate. In addition, the OLED display has advantages of a lower driving voltage, a lower power consumption, and a better color tone as compared to a plasma display panel or an inorganic electroluminescent display.

The OLED display manufactured on the flexible substrate includes a display unit which includes a plurality of sub-pixels to implement an image, a gate-in-panel (GIP) driver for applying a gate driving signal to the display unit, and a pad portion which receives signals from the outside and transmits the signals to the display unit. The GIP driver includes a large-sized thin film transistor having a channel of a relatively large size. Thin film transistors generally generate heat during their operation. As the size of the thin film transistor increases, heat generated in the thin film transistor increases. High heat generated in the large-sized thin film transistor of the GIP driver can be transferred to an organic layer adjacent to the large-sized thin film transistor, thereby causing damage to the organic layer. Hence, gas can be generated in the organic layer. The gas generated in the organic layer exists at an interface between layers of the GIP driver and peels the layers, thereby damaging the large-sized thin film transistor. As a result, the GIP driver cannot be driven.

SUMMARY

The present disclosure provides a display device and a method for manufacturing the same capable of preventing a defective drive of a gate-in-panel (GIP) driver by dissipating high heat generated in a large-sized thin film transistor of the GIP driver.

In one aspect, there is provided a display device including a flexible substrate, a gate-in-panel (GIP) driver and a display unit disposed on the flexible substrate, a protective member disposed under the flexible substrate, and a heat pad disposed between the flexible substrate and the protective member and overlapping the GIP driver.

The GIP driver includes a large-sized thin film transistor (TFT) portion, a small-sized TFT portion, and a clock line portion. The large-sized TFT portion is disposed between the small-sized TFT portion and the display unit.

The heat pad overlaps at least the large-sized TFT portion. The flexible substrate includes at least one groove in a lower surface of the flexible substrate, and the heat pad is disposed in the groove. The display device further comprising a metal protective member disposed on the display unit, the heat pad is grounded to the metal protective member through a conductive member.

Alternatively, the heat pad overlaps at least the large-sized TFT portion and the small-sized TFT portion. The flexible substrate includes at least one groove in a lower surface of the flexible substrate, and the heat pad is disposed in the groove. The display device further comprising a metal protective member disposed on the display unit, the heat pad is grounded to the metal protective member through a conductive member.

Alternatively, the heat pad overlaps the large-sized TFT portion, the small-sized TFT portion, and the clock line portion. The flexible substrate includes at least one groove in a lower surface of the flexible substrate, and the heat pad is disposed in the groove. The display device further comprising a metal protective member disposed on the display unit, the heat pad is grounded to the metal protective member through a conductive member.

The flexible substrate includes at least one groove in a lower surface of the flexible substrate, and the heat pad is disposed in the groove. The heat pad has at least one pattern.

The heat pad is formed of metal or metal oxide. The heat pad has a thickness of 10 nm to 1,000 nm.

In another aspect, there is provided a method for manufacturing a display device including forming a sacrifice layer on a support substrate, forming a heat pad on the sacrifice layer, forming a flexible substrate on the heat pad, forming a gate-in-panel (GIP) driver and a display unit on the flexible substrate, irradiating a laser onto the sacrifice layer to separate the support substrate and the sacrifice layer from the flexible substrate, and attaching a protective member to a lower surface of the flexible substrate.

In a further aspect, there is provided a display device, including a flexible substrate; a gate-in-panel driver disposed over the flexible substrate and including a first thin film transistor portion, a second thin film transistor portion, and a clock line portion; and a heat pad disposed at the flexible substrate and overlapping at least one of the first thin film transistor portion, the second thin film transistor portion, and the clock line portion, and dissipating heat generated from the gate-in-panel driver.

It is to be understood that both the foregoing general description and the following description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, In the drawings.

DETAILED DESCRIPTION

Reference will now be made in detail to aspects of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the aspects of the disclosure. Names of the respective elements used in the following explanations are selected only for convenience of writing the specification and may be thus different from those used in actual products.

A display device according to an exemplary aspect is a flexible display device, in which a display element is formed on a flexible substrate. Examples of the flexible display device include an organic light emitting diode (OLED) display, a liquid crystal display (LCD), and an electrophoresis display. Aspects of the disclosure are described using the OLED display by way of example. An OLED display includes an organic layer formed of an organic material between a first electrode serving as an anode and a second electrode serving as a cathode. The OLED display is a self-emission display device configured to form hole-electron pairs, i.e., excitons by combining holes received from the first electrode and electrons received from the second electrode inside the organic layer and emit light by energy generated when the excitons return to a ground level.

Example aspects are described below with reference to FIGS. 1 to 25.

Figure 1:
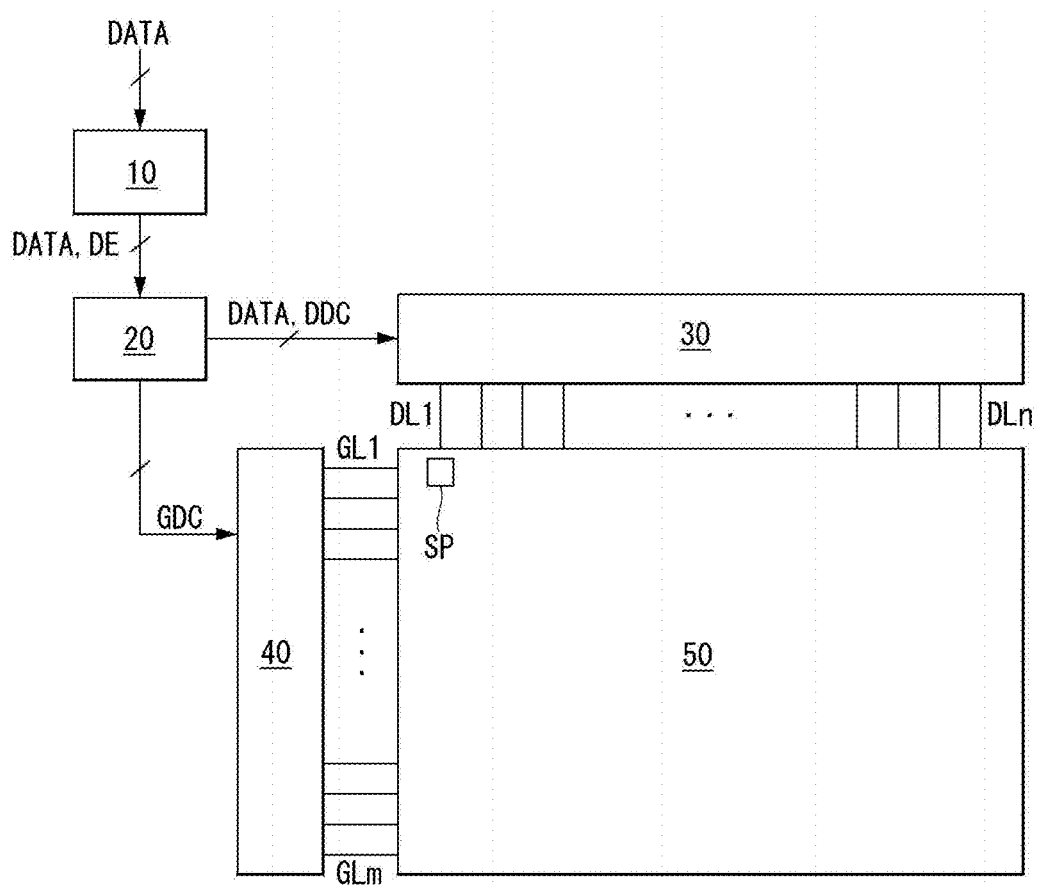
FIG. 1 is a schematic block diagram of an organic light emitting diode (OLED) display according to an exemplary aspect.
Figure 2:
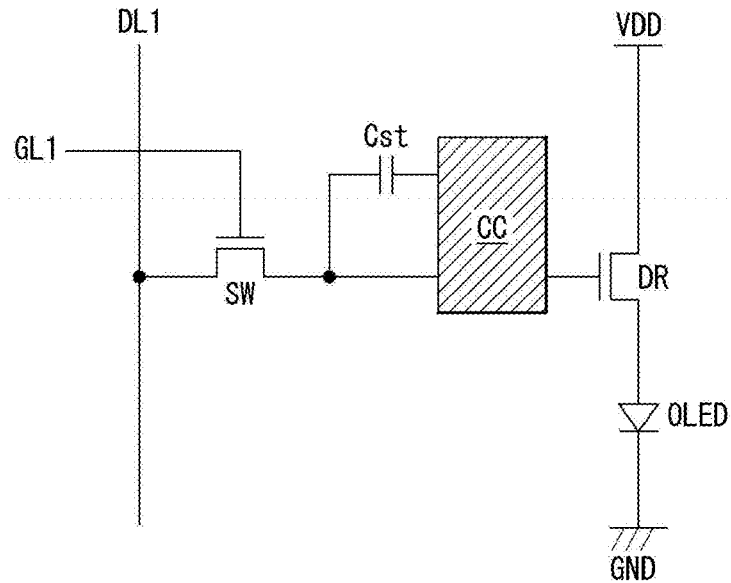
FIG. 2 illustrates an example of a circuit configuration of a subpixel.
Figure 3:
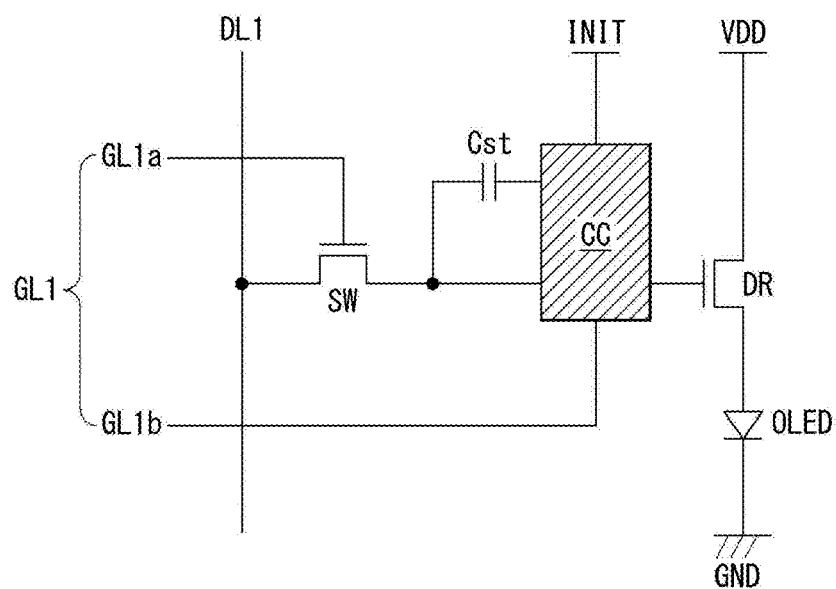
FIG. 3 illustrates another example of a circuit configuration of a subpixel.

FIG. 1 is a schematic block diagram of an OLED display according to an exemplary aspect. FIG. 2 illustrates an example of a circuit configuration of a subpixel. FIG. 3 illustrates another example of a circuit configuration of a subpixel.

Referring to FIG. 1, an OLED display according to an exemplary aspect includes an image processing unit 10, a timing controller 20, a data driver 30, a gate driver 40, and a display panel 50.

The image processing unit 10 outputs a data signal DATA and a data enable signal DE supplied from the outside. The image processing unit 10 may output one or more of a vertical sync signal, a horizontal sync signal, and a clock signal in addition to the data enable signal DE. For the sake of brevity, these signals are not shown. The image processing unit 10 is formed on a system circuit board as an integrated circuit (IC).

The timing controller 20 receives the data signal DATA and driving signals including the data enable signal DE or the vertical sync signal, the horizontal sync signal, the clock signal, etc. from the image processing unit 10.

The timing controller 20 outputs a gate timing control signal GDC for controlling operation timing of the gate driver 40 and a data timing control signal DDC for controlling operation timing of the data driver 30 based on the driving signals. The timing controller 20 may be formed on a control circuit board as an IC.

The data driver 30 samples and latches the data signal DATA received from the timing controller 20 in response to the data timing control signal DDC supplied from the timing controller 20 and converts the sampled and latched data signal DATA using gamma reference voltages. The data driver 30 outputs the converted data signal DATA to data lines DL1 to DLn. The data driver 30 is attached to a substrate as an IC.

The gate driver 40 outputs a gate signal while shifting a level of a gate voltage in response to the gate timing control signal GDC supplied from the timing controller 20. The gate driver 40 outputs the gate signal to gate lines GL1 to GLm. The gate driver 40 is formed on a gate circuit board as an IC or is formed on the display panel 50 in a gate-in-panel (GIP) manner.

The display panel 50 displays an image in response to the data signal DATA and the gate signal respectively received from the data driver 30 and the gate driver 40. The display panel 50 includes subpixels SP for displaying an image.

As shown in FIG. 2, each subpixel may include a switching transistor SW, a driving transistor DR, a compensation circuit CC, and an organic light emitting diode (OLED). The OLED operates to emit light based on a driving current generated by the driving transistor DR.

The switching transistor SW performs a switching operation so that a data signal supplied through a first data line DL1 is stored in a capacitor Cst as a data voltage in response to a gate signal supplied through a gate line GL1. The driving transistor DR enables a driving current to flow between a high potential power line VDD and a low potential power line GND based on the data voltage stored in the capacitor Cst. The compensation circuit CC is a circuit for compensating for a threshold voltage of the driving transistor DR. A capacitor connected to the switching transistor SW or the driving transistor DR may be mounted inside the compensation circuit CC. The compensation circuit CC includes one or more thin film transistors (TFTs) and a capacitor. Configuration of the compensation circuit CC may be variously changed depending on a compensation method. A brief description of the compensation circuit CC will be made.

As shown in FIG. 3, a subpixel including the compensation circuit CC may further include a signal line and a power line for driving a compensation TFT and supplying a predetermined signal or electric power. The gate line GL1 may include a 1-1 gate line GL1a supplying the gate signal to the switching transistor SW and a 1-2 gate line GL1b for driving the compensation TFT included in the subpixel. The added power line may be defined as an initialization power line INIT for initializing a predetermined node of the subpixel to a predetermined voltage. However, this is merely an example, and aspects are not limited thereto.

FIGS. 2 and 3 illustrate that one subpixel includes the compensation circuit CC by way of example. However, the compensation circuit CC may be omitted when an object (for example, the data driver 30) to be compensated is positioned outside the subpixel. The subpixel has a configuration of 2T(Transistor)1C(Capacitor) structure in which the switching transistor SW, the driving transistor DR, the capacitor, and the OLED are provided. However, when the compensation circuit CC is added to the subpixel, the subpixel may have various configurations such as 3T1C, 4T2C, 5T2C, 6T2C, 7T2C, and the like. Also, FIGS. 2 and 3 illustrate that the compensation circuit CC is positioned between the switching transistor SW and the driving transistor DR by way of an example. However, the compensation circuit CC may be further positioned between the driving transistor DR and the OLED. The position and the structure of the compensation circuit CC are not limited to the ones illustrated in FIGS. 2 and 3.

First Example

Figure 4:
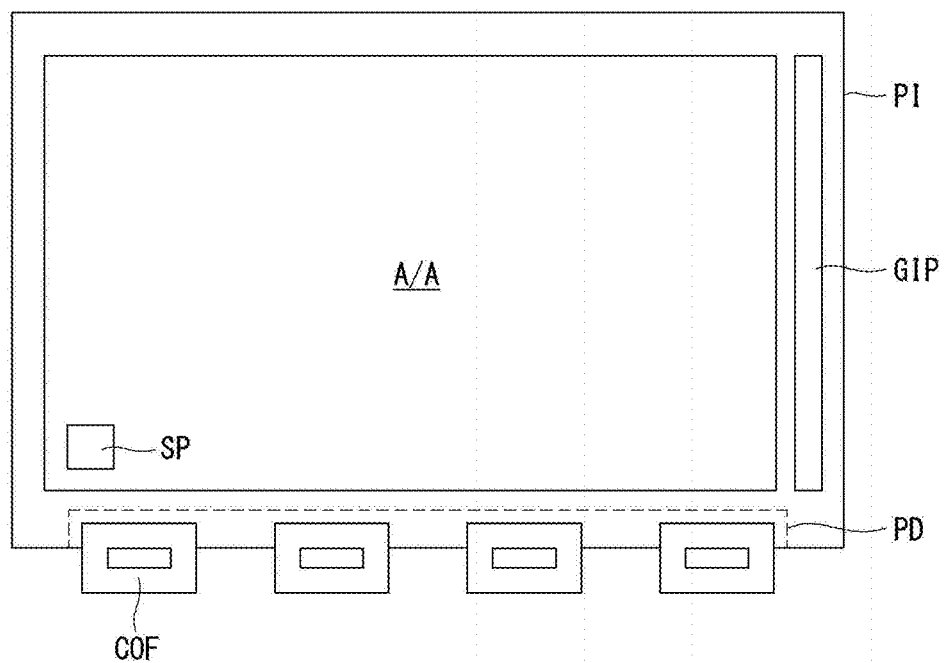
FIG. 4 is a plan view of an OLED display according to an exemplary aspect.
Figure 5:
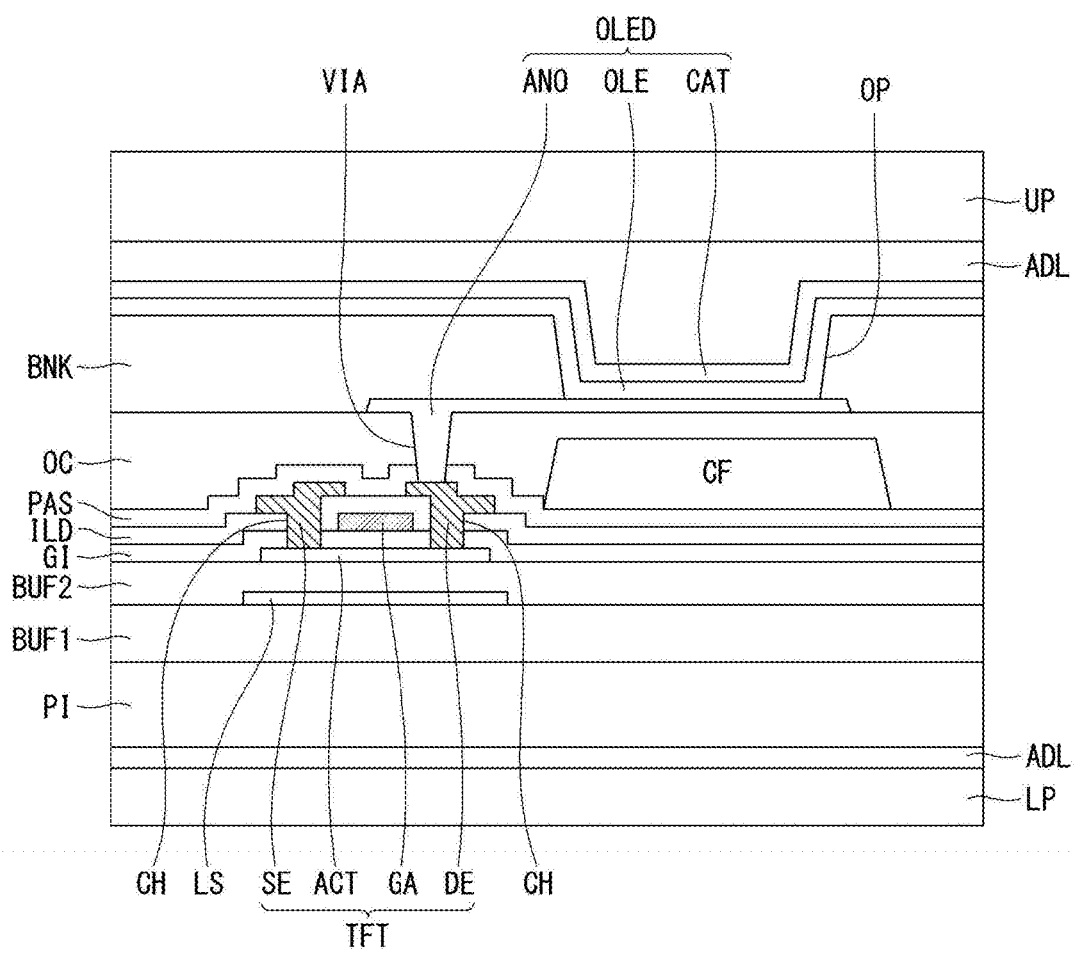
FIG. 5 is a cross-sectional view illustrating a subpixel of an OLED display according to an exemplary aspect.
Figure 6:
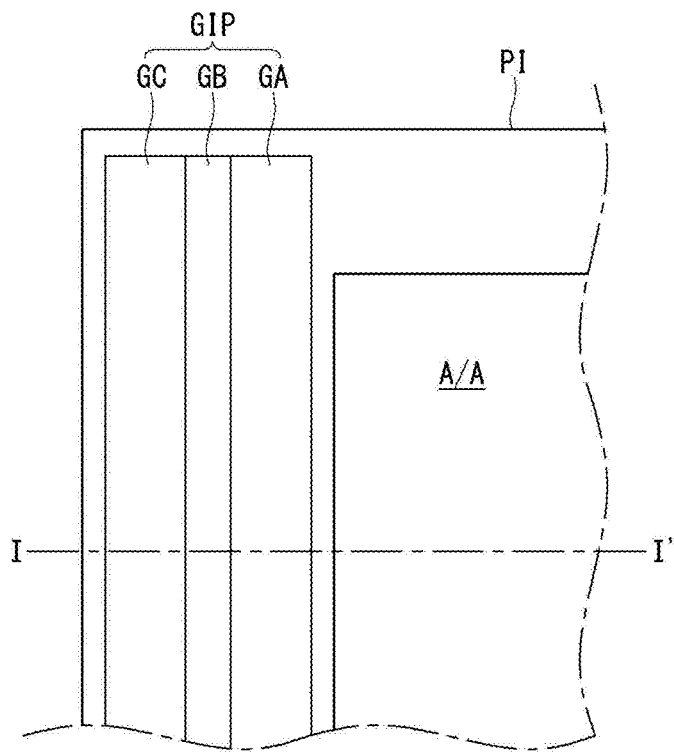
FIG. 6 is a partial enlarged plan view of a portion of FIG. 4.
Figure 7:
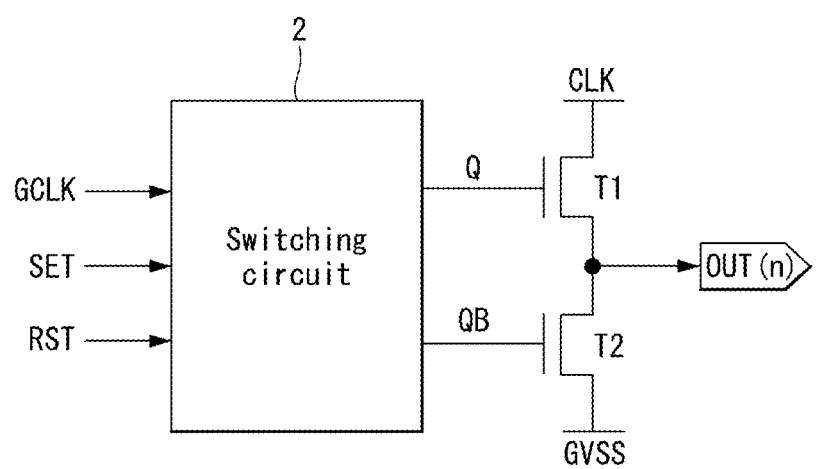
FIG. 7 is a circuit diagram of a gate-in-panel (GIP) driver.
Figure 8:
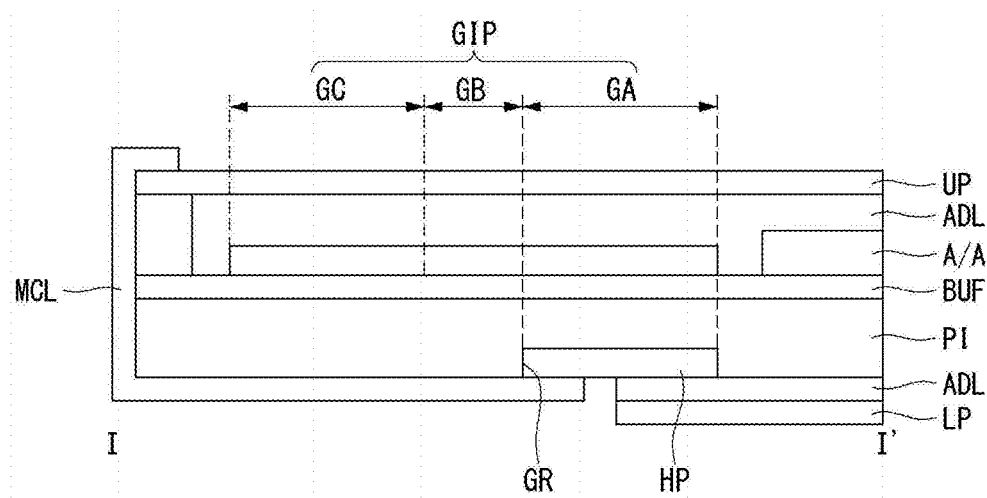
FIG. 8 is a cross-sectional view taken along line I-I' of FIG. 6.
Figure 9:
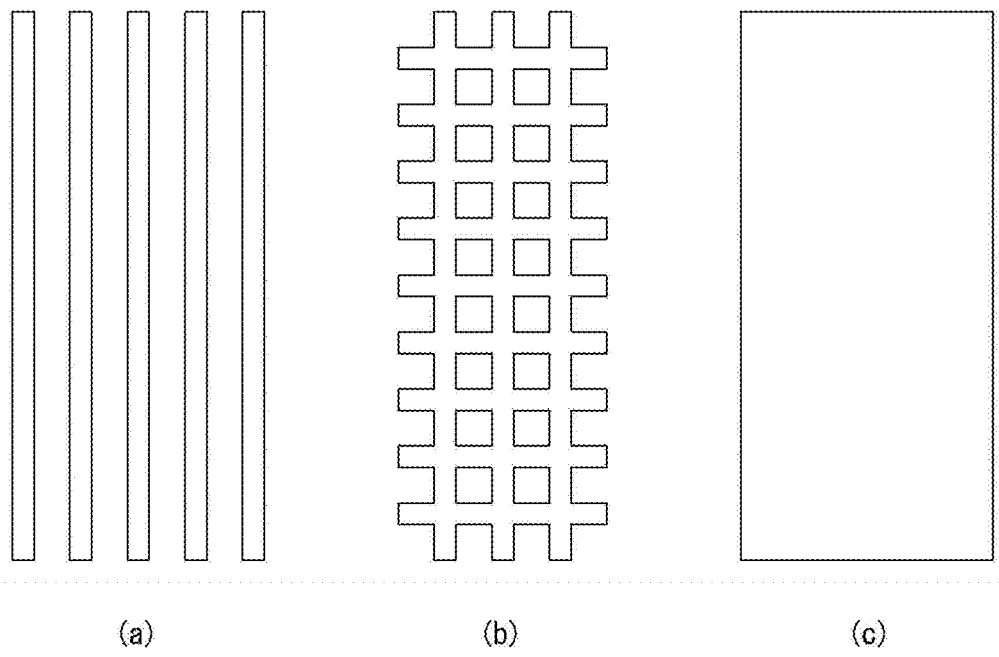
FIG. 9 is a plan view illustrating shapes of a heat pad.
Figure 10:
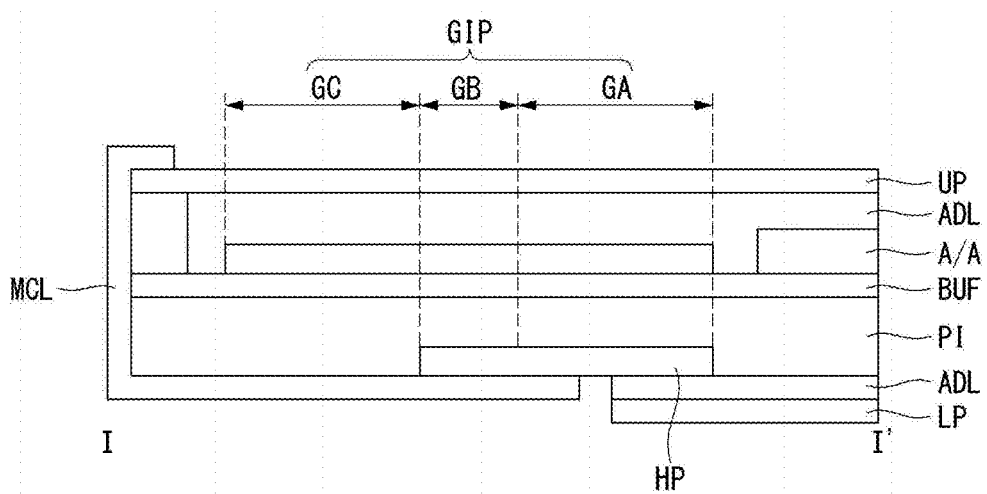
FIGS. 10 and 11 are cross-sectional views of an OLED display according to another exemplary aspect.
Figure 11:
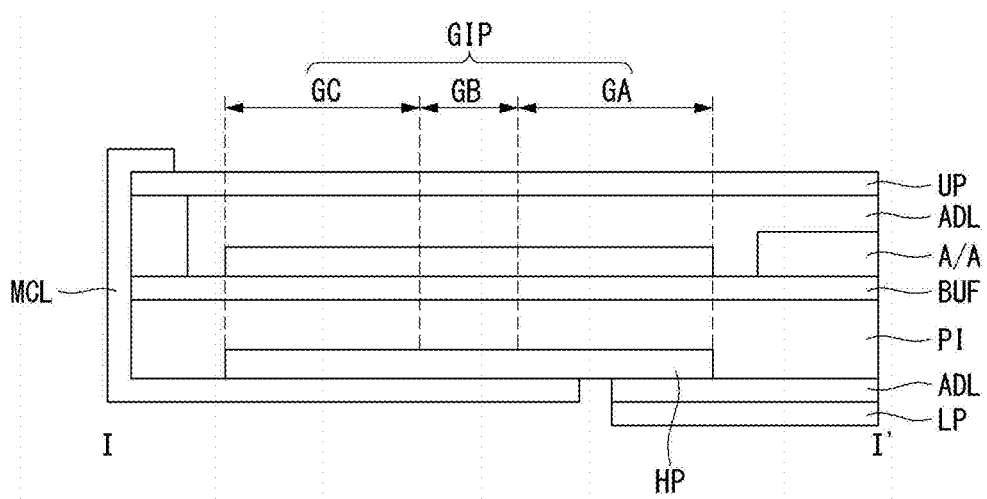

FIG. 4 is a plan view of an OLED display according to an exemplary aspect. FIG. 5 is a cross-sectional view illustrating a subpixel of an OLED display according to an exemplary aspect. FIG. 6 is a partial enlarged plan view of a portion of FIG. 4. FIG. 7 is a circuit diagram of a gate-in-panel (GIP) driver. FIG. 8 is a cross-sectional view taken along line I-I' of FIG. 6. FIG. 9 is a plan view illustrating shapes of a heat pad. FIGS. 10 and 11 are cross-sectional views of an OLED display according to another exemplary aspect.

Referring to FIG. 4, an OLED display includes a flexible substrate PI, a display unit A/A, a GIP driver GIP disposed on a right side of the flexible substrate PI outside the display unit A/A, and a pad portion PD disposed on a lower side of the flexible substrate PI. The display unit A/A may include a plurality of subpixels SP. For example, R (red), G (green), and B (blue) subpixels or R, G, B, and W (white) subpixels of the display unit A/A may emit light to represent the full color. The GIP driver GIP is disposed on one side, for example, the right side of the display unit A/A and applies a gate driving signal to the display unit A/A. Chip-on films (COF) are attached to the pad portion PD disposed on one side, for example, the lower side of the display unit A/A. A data signal and electric power are applied to a plurality of signal lines (not shown) connected to the display unit A/A through the chip-on films (COF).

A cross-sectional view of a subpixel SP of the OLED display according to the aspect is described below with reference to FIG. 5.

As shown in FIG. 5, in the OLED display according to the aspect, a first buffer layer BUF1 is positioned on the flexible substrate PI. The flexible substrate PI may be, for example, a polyimide substrate. Thus, the flexible substrate PI according to the aspect may have a flexible characteristic. The first buffer layer BUF1 protects a thin film transistor formed in a subsequent process from impurities, for example, alkali ions discharged from the flexible substrate PI. The first buffer layer BUF1 may be a silicon oxide ($SiO_x$) layer, a silicon nitride ($SiN_x$) layer, or a multilayer thereof.

A shield layer LS is positioned on the first buffer layer BUF1. The shield layer LS prevents a reduction in a panel driving current which may be generated by using a polyimide substrate. A second buffer BUF2 is positioned on the shield layer LS. The second buffer BUF2 protects a thin film transistor formed in a subsequent process from impurities, for example, alkali ions discharged from the shield layer LS. The second buffer layer BUF2 may be a silicon oxide ($SiO_x$) layer, a silicon nitride ($SiN_x$) layer, or a multilayer thereof.

A semiconductor layer ACT is positioned on the second buffer layer BUF2 and may be formed of a silicon semiconductor or an oxide semiconductor. The silicon semiconductor may include amorphous silicon or crystallized polycrystalline silicon. The polycrystalline silicon has a high mobility (for example, more than 100 $cm^2/Vs$), a low power consumption, and an excellent reliability. Thus, the polycrystalline silicon can be applied for a gate driver and/or a multiplexer (MUX) for use in a driving element or applied to a driving TFT of each pixel of the OLED display. Because the oxide semiconductor has a low OFF-current, the oxide semiconductor is suitable for a switching TFT which has a short ON-time and a long OFF-time. Further, because the oxide semiconductor increases a voltage hold time of the pixel due to the low OFF-current, the oxide semiconductor is suitable for a display device requiring a low-speed drive and/or low power consumption. In addition, the semiconductor layer ACT includes a drain region and a source region each including p-type or n-type impurities, and also includes a channel region between the drain region and the source region.

A gate insulating layer GI is positioned on the semiconductor layer ACT and may be formed of a silicon oxide ($SiO_x$) layer, a silicon nitride ($SiN_x$) layer, or a multilayer thereof. A gate electrode GA is positioned on the gate insulating layer GI at a location corresponding to a predetermined region (i.e., the channel region when impurities are injected) of the semiconductor layer ACT. The gate electrode GA may be formed of one of molybdenum (Mo), aluminum (Al), chrome (Cr), gold (Au), titanium (Ti), nickel (Ni), neodymium (Nd), and copper (Cu), or a combination thereof. Further, the gate electrode GA may be a multilayer formed of one of molybdenum (Mo), aluminum (Al), chrome (Cr), gold (Au), titanium (Ti), nickel (Ni), neodymium (Nd), and copper (Cu), or a combination thereof. For example, the gate electrode GA may be formed as a double layer of Mo/Al—Nd or Mo/Al.

An interlayer dielectric layer ILD is positioned on the gate electrode GA and insulates the gate electrode GA. The interlayer dielectric layer ILD may be formed of a silicon oxide (SiOx) layer, a silicon nitride ($SiN_x$) layer, or a multilayer thereof. Contact holes CH exposing a portion of the semiconductor layer ACT are formed at a portion where each of the interlayer dielectric layer ILD and the gate insulating layer GI is formed.

A drain electrode DE and a source electrode SE are positioned on the interlayer dielectric layer ILD. The drain electrode DE is connected to the semiconductor layer ACT through the contact hole CH exposing the drain region of the semiconductor layer ACT, and the source electrode SE is connected to the semiconductor layer ACT through the contact hole CH exposing the source region of the semiconductor layer ACT. Each of the source electrode SE and the drain electrode DE may be formed as a single layer or as a multilayer. When each of the source electrode SE and the drain electrode DE is formed as the single layer, each of the source electrode SE and the drain electrode DE may be formed of one of molybdenum (Mo), aluminum (Al), chrome (Cr), gold (Au), titanium (Ti), nickel (Ni), neodymium (Nd), and copper (Cu), or a combination thereof. When each of the source electrode SE and the drain electrode DE is formed as the multilayer, each of the source electrode SE and the drain electrode DE may be formed as a double layer of Mo/Al—Nd or as a triple layer of Ti/Al/Ti, Mo/Al/Mo or Mo/Al-Nd/Mo. Thus, a thin film transistor TFT including the semiconductor layer ACT, the gate electrode GA, the source electrode SE, and the drain electrode DE can be formed.

Further, a passivation layer PAS is positioned on the flexible substrate PI including the thin film transistor TFT. The passivation layer PAS is an insulating layer protecting the component underlying the passivation layer PAS and may be formed of a silicon oxide ($SiO_x$) layer, a silicon nitride ($SiN_x$) layer, or a multilayer thereof. A color filter CF is positioned on the passivation layer PAS. The color filter CF serves to convert white light emitted by an organic light emitting diode OLED into red, green, or blue light. An overcoat layer OC is positioned on the color filter CF. The overcoat layer OC may be a planarization layer for reducing a height difference (or step coverage) of an underlying structure and may be formed of an organic material such as polyimide, benzocyclobutene-based resin, and acrylate. For example, the overcoat layer OC may be formed through a spin-on glass (SOG) method for coating an organic material in a liquid state and then curing the organic material.

A via hole VIA exposing the drain electrode DE of the thin film transistor TFT is positioned in a portion of the overcoat layer OC. The organic light emitting diode OLED is positioned on the overcoat layer OC. More specifically, a first electrode ANO is positioned on the overcoat layer OC. The first electrode ANO serves as a pixel electrode and is connected to the drain electrode DE of the thin film transistor TFT through the via hole VIA. The first electrode ANO can be an anode and may be formed of a transparent conductive material such as indium tin oxide (ITO), indium zinc oxide (IZO), and zinc oxide (ZnO). When the first electrode ANO is a reflective electrode, the first electrode ANO may further include a reflective layer. The reflective layer may be formed of aluminum (Al), copper (Cu), silver (Ag), nickel (Ni), and palladium (Pd), or a combination thereof. For example, the reflective layer may be formed of an Ag/Pd/Cu (APC) alloy.

In addition, a bank layer BNK defining pixels is positioned on the flexible substrate PI including the first electrode ANO. The bank layer BNK may be formed of an organic material such as polyimide, benzocyclobutene-based resin, and acrylate. The bank layer BNK includes a pixel definition portion OP exposing the first electrode ANO. An organic layer OLE contacting the first electrode ANO is positioned at a front surface of the flexible substrate PI. The organic layer OLE is a layer, in which electrons and holes combine and emit light. A hole injection layer and/or a hole transport layer may be positioned between the organic layer OLE and the first electrode ANO, and an electron injection layer and/or an electron transport layer may be positioned on the organic layer OLE.

A second electrode CAT is positioned on the organic layer OLE and may be positioned on the entire surface of the display area A/A (shown in FIG. 4). In addition, the second electrode CAT can be a cathode electrode and may be formed of magnesium (Mg), calcium (Ca), aluminum (Al), silver (Ag), or a combination thereof each having a low work function. When the second electrode CAT is a transmissive electrode, a thickness of the second electrode CAT may be thin enough to transmit light. Further, when the second electrode CAT is a reflective electrode, a thickness of the second electrode CAT may be thick enough to reflect light.

An upper protective member UP is attached to an upper surface of the flexible substrate PI, on which the thin film transistor TFT and the organic light emitting diode OLED are formed, through an adhesive layer ADL. The upper protective member UP may be a transparent flexible substrate or a metal thin film. Further, a lower protective member LP is attached to a lower surface of the flexible substrate PI through an adhesive layer ADL. Because the lower protective member LP transmits light, the lower protective member LP may be formed of a transparent plastic film.

Referring to FIG. 6, the GIP driver GIP according to the aspect is disposed on one side of the display unit A/A. The GIP driver GIP includes a large-sized TFT portion GA, a small-sized TFT portion GB, and a clock line portion GC. The large-sized TFT portion GA is disposed closest to the display unit A/A, and the small-sized TFT portion GB is disposed in the middle of the GIP driver GIP. The clock line portion GC is disposed adjacent to the outermost side of the flexible substrate PI.

More specifically, as shown in FIG. 7, the GIP driver GIP according to the aspect includes a shift register. The shift register includes a plurality of cascade-connected stages and shifts an output voltage in accordance with shift clock timing. Each stage of the shift register includes a pull-up transistor T1 that charges an output terminal OUT(n) in response to a voltage of a Q node and increases an output voltage, a pull-down transistor T2 that discharges the output terminal OUT(n) in response to a voltage of a QB node and reduces the output voltage, and a switching circuit 2 for charging and discharging the Q node and the QB node. When a shift clock CLK is input to a drain of the pull-up transistor T1 in a state where the Q node is pre-charged to a gate high voltage VGH, the pull-up transistor T1 charges the output terminal OUT(n) to the gate high voltage VGH of the shift clock CLK. When the QB node is charged to the gate high voltage VGH, the pull-down transistor T2 connects the output terminal OUT(n) to a GVSS terminal supplied with a gate low voltage VGL and discharges a voltage Vout(n) of the output terminal OUT(n) to the gate low voltage VGL. The switching circuit 2 charges the Q node in response to a set signal SET and discharges the Q node in response to a reset signal RST. The switching circuit 2 charges and discharges the QB node using an inverter as opposed to the Q node. The set signal SET may be a start pulse or a carry signal input from a previous stage. The reset signal RST may be a reset signal for simultaneously initializing all the stages and/or a carry signal input from a next stage.

The large-sized TFT portion GA of the GIP driver GIP according to the aspect includes the pull-up transistor T1 and the pull-down transistor T2. Because the pull-up transistor T1 and the pull-down transistor T2 of the large-sized TFT portion GA are required to have a large current driving capability, their size is much larger than transistors constituting the switching circuit 2. The small-sized TFT portion GB of the GIP driver GIP according to the aspect includes the transistors of the switching circuit 2. The clock line portion GC of the GIP driver GIP according to the aspect includes clock lines through which various signals GCLK, SET and RST are applied to the small-sized TFT portion GB.

The GIP driver GIP generates high heat during its operation due to the very large size of the transistors constituting the large-sized TFT portion GA of the GIP driver GIP. Thus, the OLED display according to the aspect further includes a heat pad capable of dissipating high heat generated in the GIP driver GIP.

Referring to FIG. 8, a buffer layer BUF is disposed on the flexible substrate PI, and the GIP driver GIP and the display unit A/A are disposed on the buffer layer BUF. The GIP driver GIP includes the large-sized TFT portion GA, the small-sized TFT portion GB, and the clock line portion GC. A metal protective member UP is disposed on the GIP driver GIP and the display unit A/A through an adhesive layer ADL. The metal protective member UP may be formed of a metal material and protects the display unit A/A from an external impact or external moisture. A lower protective member LP is disposed under the flexible substrate PI and is attached to the flexible substrate PI through an adhesive layer ADL. The lower protective member LP protects an underlying structure of the flexible substrate PI from an external impact or external moisture. The lower protective member LP may be formed of a transparent material because it has to transmit light.

A heat pad HP is disposed between the flexible substrate PI and the lower protective member LP. The heat pad HP according to the aspect is configured to dissipate the heat generated in the GIP driver GIP and is disposed to overlap the GIP driver GIP. A high heat generation portion of the GIP driver GIP corresponds to the large-sized TFT portion GA. Thus, the heat pad HP is disposed adjacent to the large-sized TFT portion GA and receives heat from the large-sized TFT portion GA, thereby dissipating the heat. When the heat pad HP overlaps the large-sized TFT portion GA, the size of the heat pad HP is not limited. However, when the heat pad HP overlaps the transistors formed in the display unit A/A, a problem of a parasitic capacitance, etc. may be generated. Hence, the heat pad HP may not overlap the display unit A/A in order to prevent such a problem.

The heat pad HP is disposed on the lower surface of the flexible substrate PI. The flexible substrate PI includes at least one groove GR, and the heat pad HP is disposed inside the groove GR. Because the flexible substrate PI is formed after the heat pad HP is formed based on the manufacturing process, the groove GR of the flexible substrate PI may be formed to have a size corresponding to a thickness of the heat pad HP. Thus, the heat pad HP is disposed in at least one groove GR of the lower surface of the flexible substrate PI.

If the heat pad HP according to the aspect is disposed on the flexible substrate PI, there may be a problem that a process design of subsequent structures is changed due to a height difference between the subsequent structures resulting from the heat pad HP on the flexible substrate PI. Further, a problem of a parasitic capacitance may be generated due to electrical interference between the components (for example, the transistors, the organic light emitting diode, etc.) on the flexible substrate PI and the conductive heat pad HP. Thus, the heat pad HP according to the aspect is disposed on the lower surface of the flexible substrate PI.

A portion of the heat pad HP for the electrical ground is exposed to the outside, and a remaining portion of the heat pad HP is covered by the lower protective member LP. A portion (for example, a lower surface) of the heat pad HP is exposed to the outside of the flexible substrate PI and is connected to a conductive member MCL connected to the metal protective member UP. Heat transferred to the heat pad HP is transferred to the metal protective member UP through the conductive member MCL. Because the metal protective member UP has a surface area substantially equal to that of the display device, a heat dissipation effect using the heat pad HP can be further improved.

The heat pad HP may be formed of a material with a good thermal conductivity to dissipate the heat generated in the GIP driver GIP. For example, the heat pad HP may be formed of metal such as aluminum (Al), gold (Au), silver (Ag), tungsten (W), and copper (Cu). Further, the heat pad HP may be formed of metal oxide including metal, for example, indium tin oxide (ITO) and indium zinc oxide (IZO). However, aspects are not limited thereto. For example, the heat pad HP according to the aspect may use any known material to which heat can be conducted.

The heat pad HP may have a thickness of 10 nm to 1,000 nm. When the thickness of the heat pad HP is equal to or greater than 10 nm, a volume of the heat pad HP can be increased. Hence, heat conduction efficiency of the heat pad HP can be improved. Further, when the thickness of the heat pad HP is equal to or less than 1,000 nm, a reduction in durability of the flexible substrate PI can be prevented.

The heat pad HP may be formed in various planar shapes. As shown in (a) of FIG. 9, the heat pad HP may include a plurality of lines extended in the same direction as a longitudinal direction of the GIP driver GIP. Alternatively, as shown in (b) of FIG. 9, the heat pad HP may be formed in a mesh shape. Alternatively, as shown in (c) of FIG. 9, the heat pad HP may be formed in a bar shape. However, aspects are not limited thereto. For example, the heat pad HP according to the aspect may use any shape capable of confirming the presence of the heat pad HP.

Referring to FIG. 10, the heat pad HP according to the aspect may be disposed to overlap the small-sized TFT portion GB adjacent to the large-sized TFT portion GA while overlapping at least the large-sized TFT portion GA. Because the small-sized TFT portion GB generates heat during its operation, heat generated in the small-sized TFT portion GB can be dissipated by the heat pad HP overlapping the small-sized TFT portion GB. Further, because the large-sized TFT portion GA and the small-sized TFT portion GB are connected to each other, heat of the large-sized TFT portion GA may be transferred to the small-sized TFT portion GB. Thus, the heat pad HP according to the aspect is disposed to overlap the large-sized TFT portion GA and the small-sized TFT portion GB, thereby dissipating the high heat generated in the GIP driver GIP.

Referring to FIG. 11, the heat pad HP according to the aspect may be disposed to overlap both the small-sized TFT portion GB and the clock line portion GC adjacent to the large-sized TFT portion GA while overlapping at least the large-sized TFT portion GA. Because the clock line portion GC is connected to the large-sized TFT portion GA and the small-sized TFT portion GB, heat generated in the large-sized TFT portion GA and the small-sized TFT portion GB may be transferred to the clock line portion GC. Thus, the heat pad HP according to the aspect is disposed to overlap the large-sized TFT portion GA, the small-sized TFT portion GB, and the clock line portion GC, thereby dissipating high heat generated in the GIP driver GIP.

Figure 12:
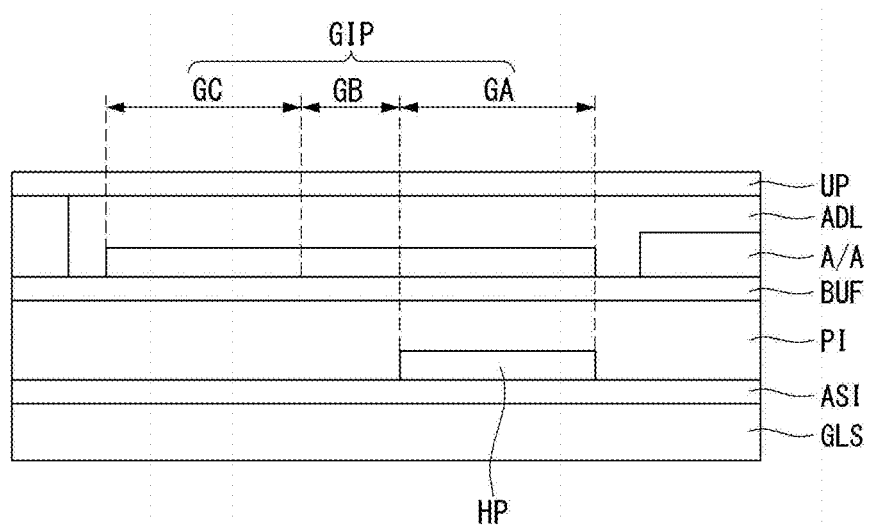
FIGS. 12 and 13 are cross-sectional views illustrating stages of a method for manufacturing an OLED display according to an exemplary aspect.
Figure 13:
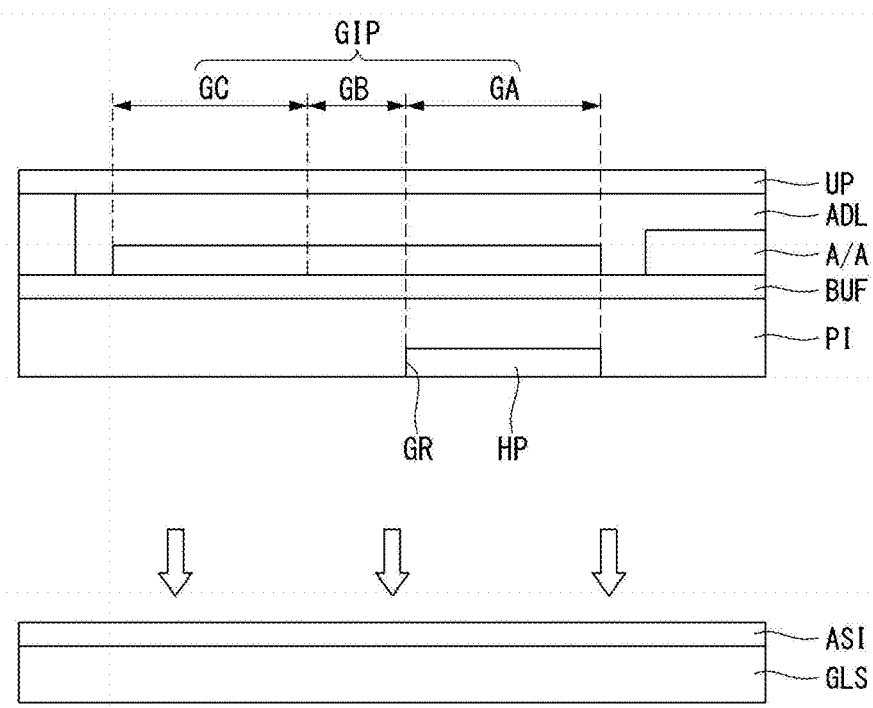

A method for manufacturing the OLED display according to the aspect is described below. FIGS. 12 and 13 are cross-sectional views illustrating stages of a method for manufacturing an OLED display according to an aspect.

As shown in FIG. 12, a sacrifice layer ASI is formed on a support substrate GLS, which is formed of a transparent material such as glass and quartz and is rigid to maintain the flatness, using a deposition method such as a chemical vapor deposition (CVD) method and a plasma enhanced chemical vapor deposition (PECVD) method. The sacrifice layer ASI may be formed of hydrogenated amorphous silicon (a-Si:H) or n- or p-doped hydrogenated amorphous silicon (a-Si:H;n$^+$ or a-Si:H;p$^+$).

A heat pad HP is formed on the sacrifice layer ASI using a deposition method such as sputtering. The heat pad HP is formed at a location corresponding to a GIP driver formed in a subsequent process. Next, a flexible substrate PI is formed on the sacrifice layer ASI, on which the heat pad HP is formed, using a solution process such as a spin coating method. The flexible substrate PI is formed by coating a polymer solution on the sacrifice layer ASI to a thickness of several μm, for example, 3 to 4 μm and then performing a thermal curing process on it. The flexible substrate PI may be made of a plastic film formed of at least one organic material of polyethylene naphthalate (PEN), polyethylene terephthalate (PET), polyethylene ether phthalate, polycarbonate (PC), polyarylate, polyetherimide, polyether sulfonate, polyimide, or polyacrylate. The flexible substrate PI is divided into a GIP driver GIP and a display unit A/A.

A buffer layer BUF is formed on the flexible substrate PI. The buffer layer BUF protects the components on the buffer layer BUF from the components underlying the buffer layer BUF and may be a silicon oxide (SiO$_x$) layer, a silicon nitride (SiN$_x$) layer, or a multilayer thereof. The GIP driver GIP and the display unit A/A of the flexible substrate PI are formed. The GIP driver GIP includes a large-sized TFT portion GA, a small-sized TFT portion GB, and a clock line portion GC. The display unit A/A includes a plurality of subpixels including switching transistors, driving transistors, sensing transistors, and organic light emitting diodes. Subsequently, a metal protective member UP is attached to the GIP driver GIP and the display unit A/A through an adhesive layer ADL.

Next, a laser beam is irradiated onto the back surface of the support substrate GLS to separate the support substrate GLS and the flexible substrate PI from each other. More specifically, when the laser beam is irradiated onto the sacrifice layer ASI between the support substrate GLS and the flexible substrate PI through the back surface of the support substrate GLS, hydrogen contained in hydrogenated amorphous silicon forming the sacrifice layer ASI is dehydrogenated, and the sacrifice layer ASI is separated from the flexible substrate PI due to the bursting of the surface of the sacrifice layer ASI. Thus, the support substrate GLS and the flexible substrate PI are separated from each other. Subsequently, the sacrificial layer ASI remaining on the surface of the flexible substrate PI is removed by wet etching using an acid solution, and the like.

Next, a lower protective member LP is attached to the lower surface of the flexible substrate PI, from which the sacrificial layer ASI is removed, using an adhesive layer ADL. A conductive member MCL, for example, an Ag dot is formed on the side of the flexible substrate PI and connects the heat pad HP on the lower surface of the flexible substrate PI to the metal protective member UP. Thus, the OLED display according to the aspect is manufactured.

As described above, the display device according to the aspect includes the heat pad on the lower surface of the flexible substrate overlapping the GIP driver and dissipates high heat generated in the GIP driver to the outside using the heat pad, thereby preventing damage caused on the GIP driver. Further, the display device according to the aspect can prevent an electrical interference between the components on the flexible substrate and the heat pad and can prevent a defective drive of the GIP driver due to the heat pad formed on the lower surface of the flexible substrate.

Figure 17:
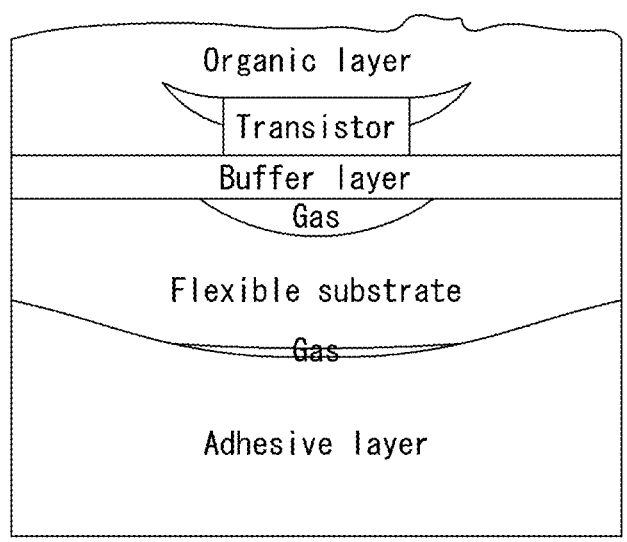
Figure 17:
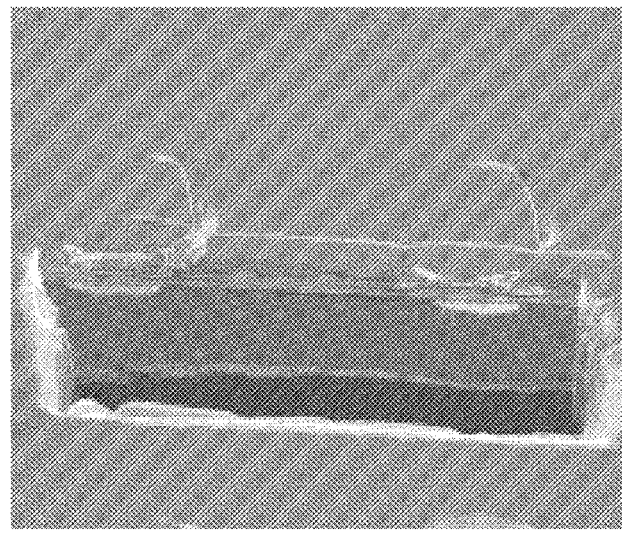
Figure 18:
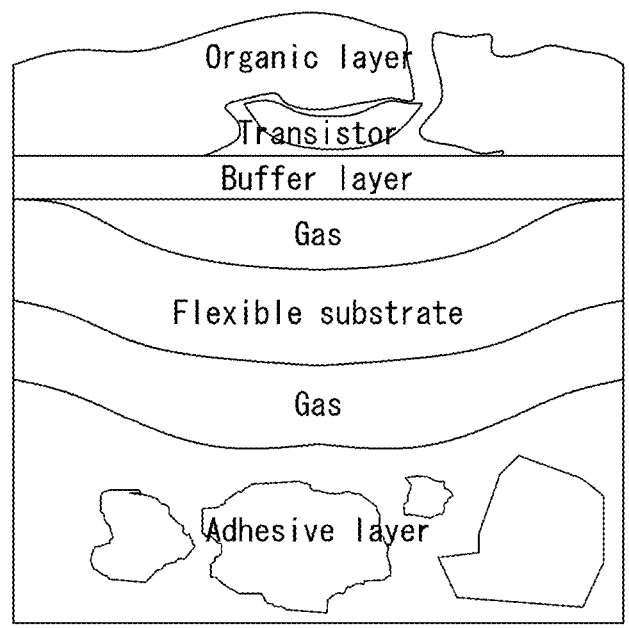
Figure 18:
Figure 19:
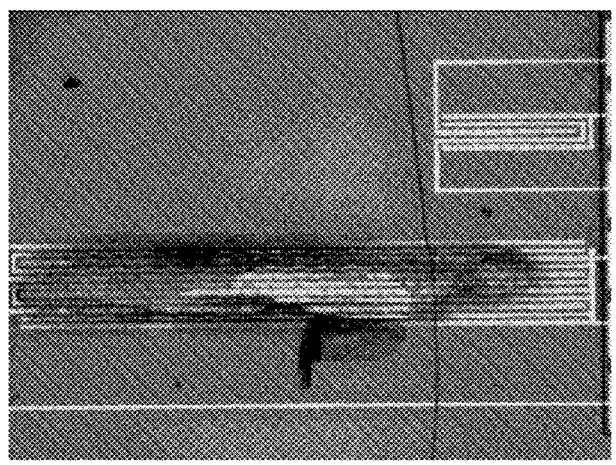
FIGS. 19 and 20 are images illustrating damage caused on a GIP driver.
Figure 20:
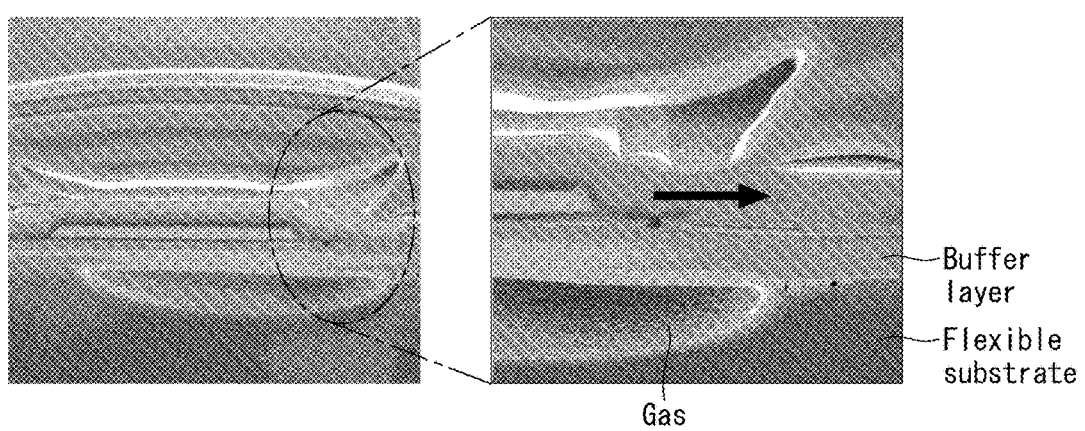

FIGS. 14 to 18 illustrate stages of a transfer mechanism of heat generated in a transistor of the GIP driver. FIGS. 19 and 20 are images illustrating damage caused on the GIP driver.

Figure 14:
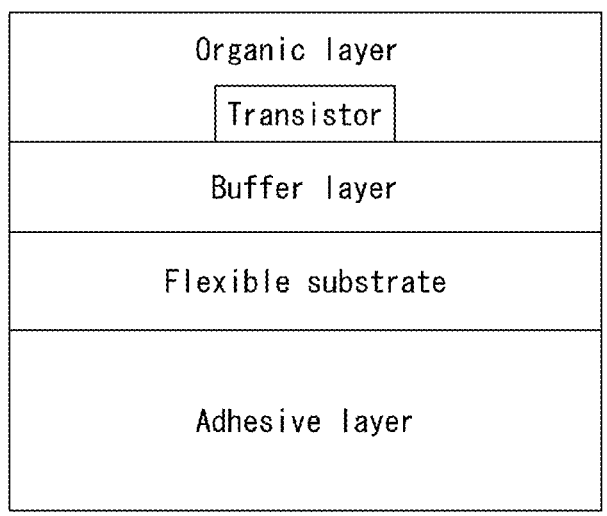
FIGS. 14 to 18 illustrate stages of a transfer mechanism of heat generated in a transistor of a GIP driver.
Figure 15:
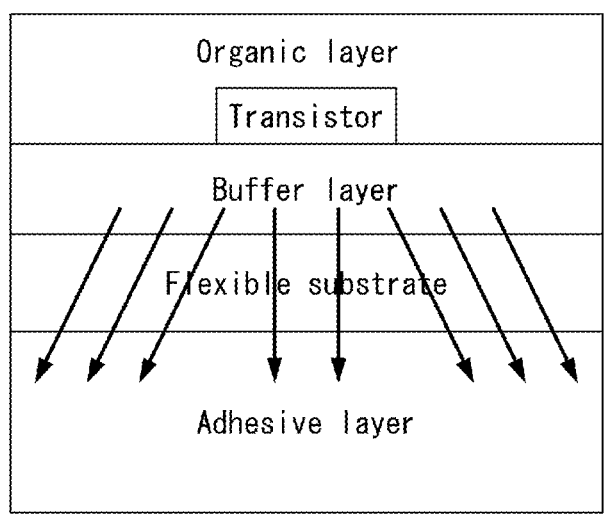
Figure 16:
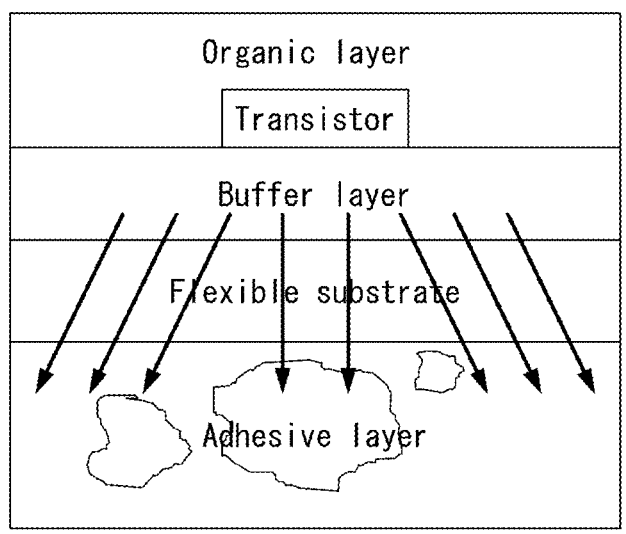
Figure 16:
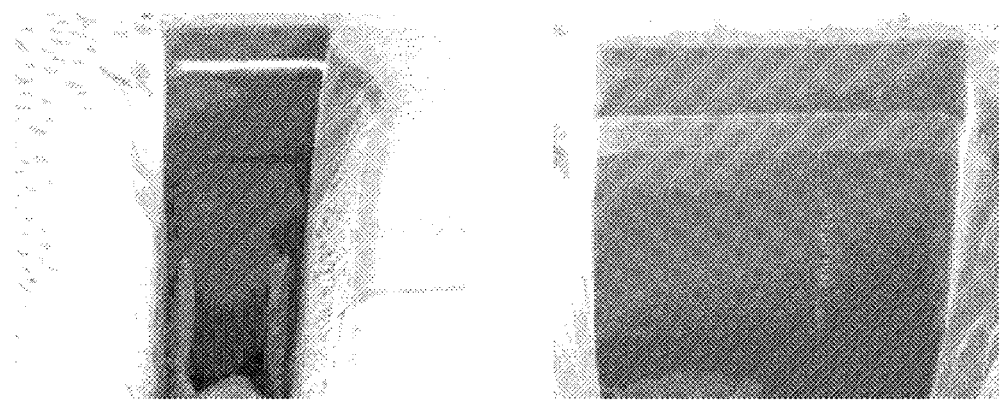

As shown in FIG. 14, a cross-sectional structure of the GIP driver shows that an adhesive layer, a flexible substrate, a buffer layer, a transistor, and an organic layer are sequentially stacked. The adhesive layer is used to attach the lower protective member to the flexible substrate, and the transistor is a transistor of the large-sized TFT portion of the GIP driver. As shown in FIG. 15, when the transistor of the large-sized TFT portion of the GIP driver is driven, high heat generated in the transistor is transferred around the transistor. Hence, as shown in FIG. 16, the adhesive layer (for example, a pressure sensitive adhesive) of which a glass transition temperature is equal to or lower than 200° C., can be damaged by the high heat of the transistor. Subsequently, as shown in FIG. 17, the organic layer (for example, a bank layer and an overcoat layer) on the transistor, of which a glass transition temperature is equal to or lower than 300° C., can be damaged by the high heat of the transistor. Then, the flexible substrate (for example, a polyimide substrate), of which a glass transition temperature is equal to or lower than 500° C., can be damaged by the high heat of the transistor. As a result, gas can be generated from the organic layer and the flexible substrate. As shown in FIG. 18, when an amount of gas generated from the organic layer and the flexible substrate increases, the organic layer is burst, and an interface between the flexible substrate and the other layer (for example, the buffer layer, the adhesive layer) is lifted. As a result, the GIP driver is completely damaged. For example, it could be seen from FIG. 19 that the GIP driver was exposed to a high temperature and was burned black. Further, it could be seen from FIG. 20 that the interface between the flexible substrate and the other layer (for example, the buffer layer, the adhesive layer) in the transistor of the large-sized TFT portion of the GIP driver was lifted and the gas was present between the flexible substrate and the other layer (for example, the buffer layer, the adhesive layer).

Figure 21:
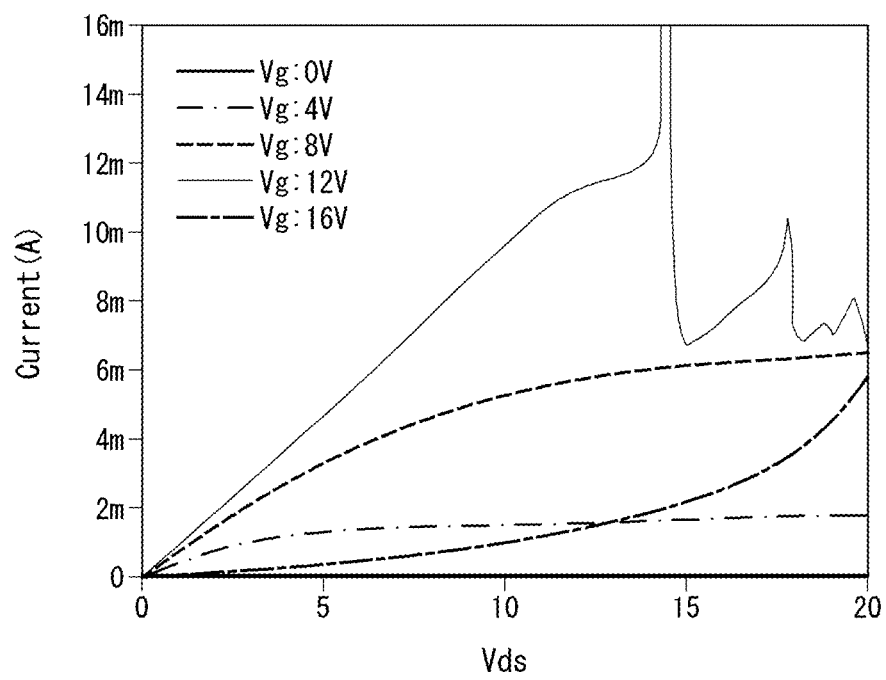
FIG. 21 is a graph illustrating a drain-to-source voltage and an amount of drain current with respect to a gate voltage of a transistor of a large-sized thin film transistor portion of a GIP driver.
Figure 22:
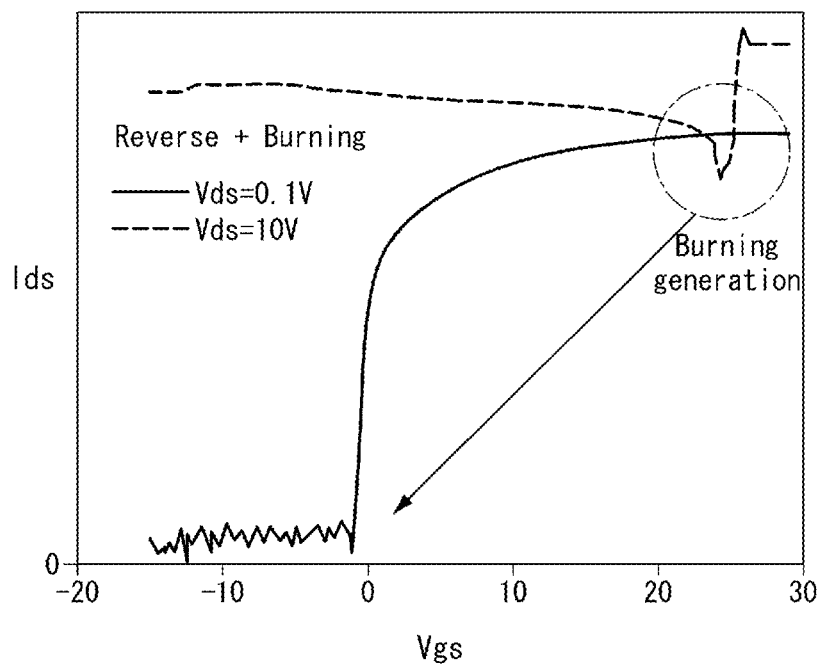
FIG. 22 is a graph illustrating an amount of drain-to-source current with respect to a gate-to-source voltage.

FIG. 21 is a graph illustrating a drain-to-source voltage and an amount of drain current with respect to a gate voltage of a transistor of the large-sized thin film transistor portion of the GIP driver. FIG. 22 is a graph illustrating an amount of drain-to-source current with respect to a gate-to-source voltage.

As shown in FIG. 21, when a gate voltage Vg was 12V, a drain-to-source voltage Vds increased from 0V to 15V. In this instance, a drain current increased to about 12 mA. When the drain-to-source voltage Vds increased to 15V or more, the drain current abnormally increased and then decreased, and repeated the increase and decrease. In other words, when the gate voltage Vg was 12V and the drain-to-source voltage Vds increased to 15V or more, a load applied to the transistor increased. Hence, the transistor continuously generated high heat and was eventually damaged.

Further, as shown in FIG. 22, when a drain-to-source voltage Vds was reduced to 0.1V, a drain-to-source current Ids normally increased as a gate-to-source voltage Vgs increased. When the drain-to-source voltage Vds increased to 10V, the transistor was damaged at the gate-to-source voltage Vgs of about 25V. Hence, the abnormal drain-to-source current Ids was generated. In other words, when the drain-to-source voltage Vds increased to 10V, a load applied to the transistor increased. Hence, the transistor continuously generated high heat and was eventually damaged.

Figure 23:
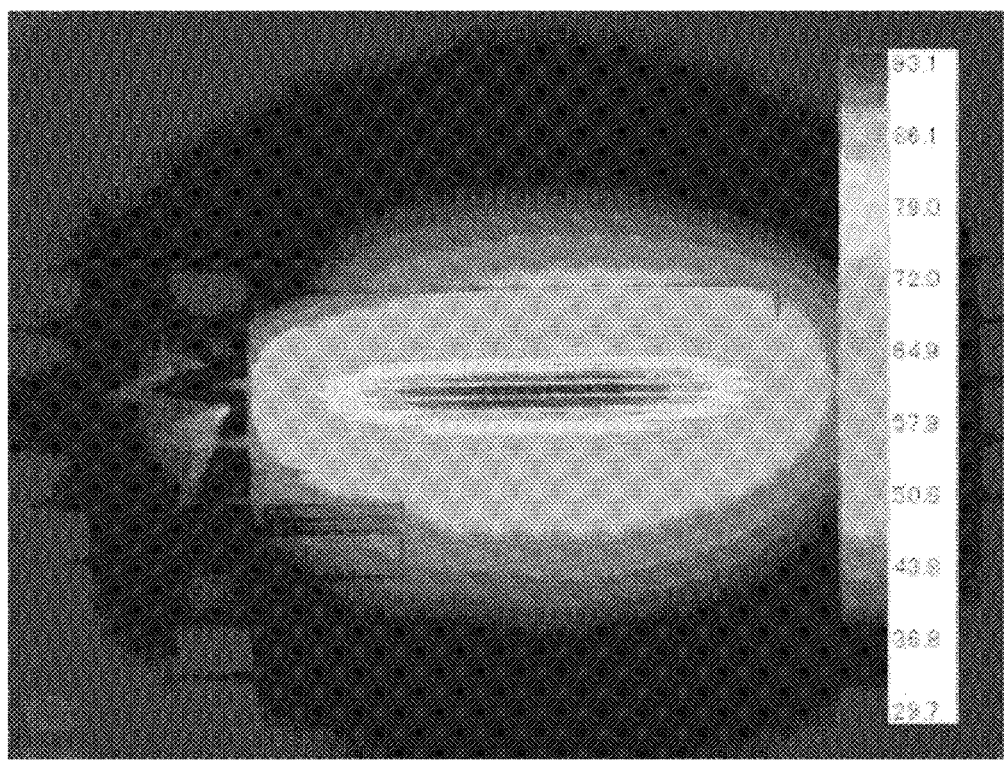
FIGS. 23 to 25 are images illustrating a temperature measured on a GIP driver during the operation of the GIP driver.
Figure 24:
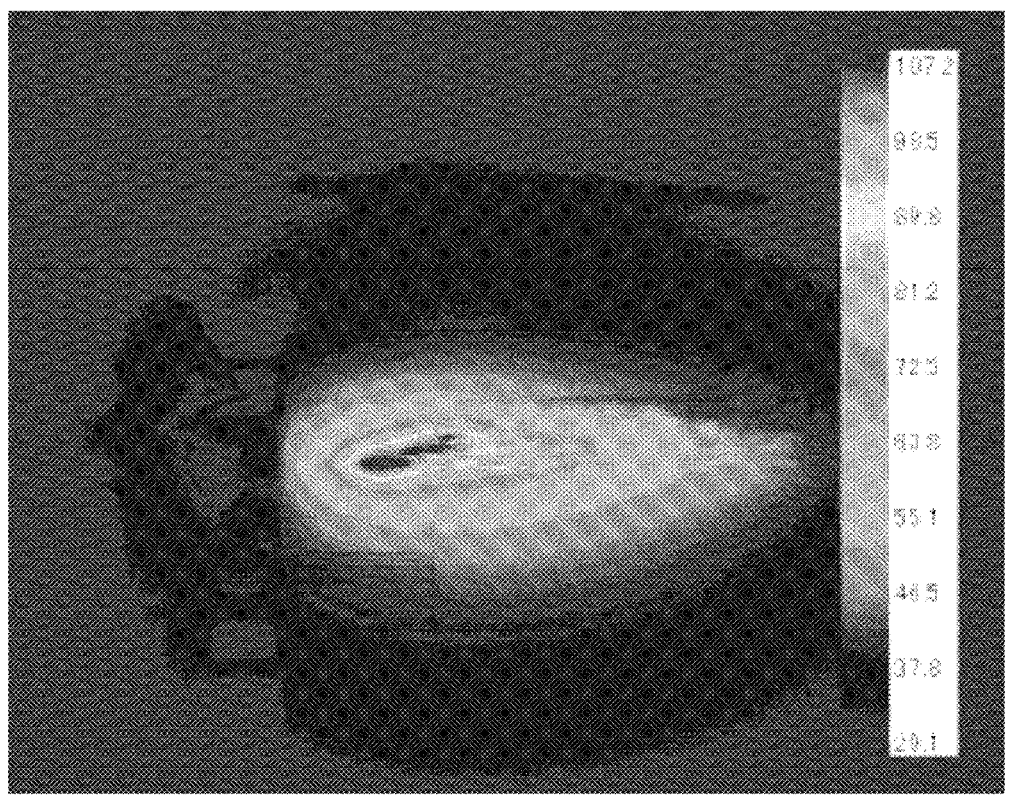
Figure 25:
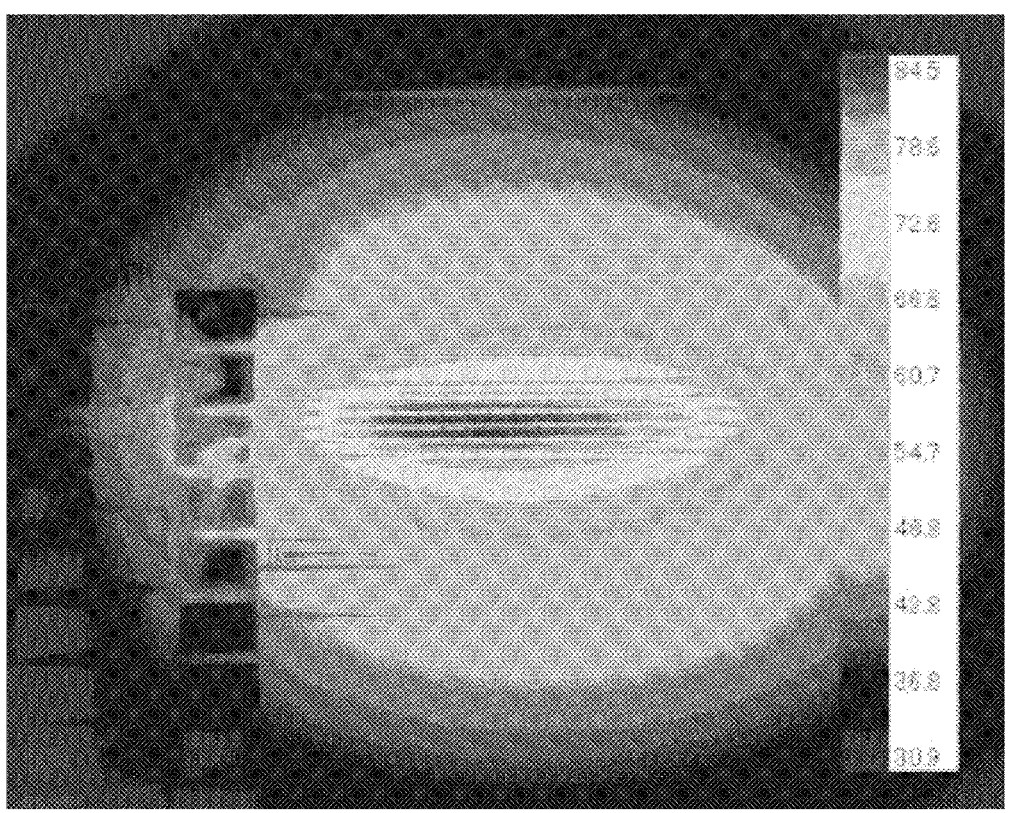

FIGS. 23 to 25 are images illustrating a temperature measured on the GIP driver during the operation of the GIP driver. As shown in FIG. 23, when the display device was driven before separating the support substrate, an average temperature of the large-sized TFT portion of the GIP driver was measured at about 101.9° C. As shown in FIG. 24, when the display device was driven after separating the support substrate, a temperature of the large-sized TFT portion of the GIP driver was abnormally measured because the large-sized TFT portion was damaged. As shown in FIG. 25, when the display device, which is configured such that the GIP driver includes the heat pad according to the aspect as shown in FIG. 8, was driven, an average temperature of the large-sized TFT portion of the GIP driver was measured at about 84.5° C.

As can be seen from FIGS. 23 to 25, the display device according to the aspect can dissipate high heat of the GIP driver and prevent damage on the GIP driver using the head pad included in the GIP driver.

As described above, the display device according to the aspect includes the heat pad on the lower surface of the flexible substrate overlapping the GIP driver and dissipates high heat generated in the GIP driver to the outside using the heat pad, thereby preventing a damage of the GIP driver. Further, the display device according to the aspect can prevent an electrical interference between the components on the flexible substrate and the heat pad and can prevent a defective drive of the GIP driver due to the heat pad formed on the lower surface of the flexible substrate.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a flexible substrate;
a gate-in-panel (GIP) driver and display area disposed at the flexible substrate;
a protective member disposed below the flexible substrate; and
a heat pad embedded in a side of the flexible substrate opposite to the GIP driver,
wherein the heat pad is disposed under and overlaps at least a portion of the GIP driver to dissipate heat generated from the GIP driver and does not overlap the display area to prevent a parasitic capacitance caused by electrical interference.

2. The display device of claim 1, wherein the GIP driver includes a first thin film transistor (TFT) portion, a second TFT portion, and a clock line portion, wherein the first TFT portion has a size greater than that of the second TFT portion.

3. The display device of claim 2, wherein the first TFT portion is disposed between the second TFT portion and the display unit.

4. The display device of claim 2, wherein the at least a portion of the GIP driver is the first TFT portion.

5. The display device of claim 4, wherein the flexible substrate includes at least one groove in a surface of the flexible substrate facing opposite to the GIP driver, and
wherein the heat pad is disposed in the at least one groove.

6. The display device of claim 4, further comprising:
a metal protective member disposed over the display unit; and
a conductive member connected to the metal protective member,
wherein the heat pad is grounded to the metal protective member through the conductive member.

7. The display device of claim 2, wherein the heat pad overlaps the first and second TFT portions.

8. The display device of claim 7, wherein the flexible substrate includes at least one groove in a surface of the flexible substrate facing opposite to the GIP driver, and
wherein the heat pad is disposed in the at least one groove.

9. The display device of claim 7, further comprising:
a metal protective member disposed at the display unit; and
a conductive member connected to the metal protective member,
wherein the heat pad is grounded to the metal protective member through the conductive member.

10. The display device of claim 2, wherein the heat pad overlaps the first TFT portion, the second TFT portion, and the clock line portion.

11. The display device of claim 10, wherein the flexible substrate includes at least one groove in a surface of the flexible substrate facing opposite to the GIP driver, and
wherein the heat pad is disposed in the at least one groove.

12. The display device of claim 10, further comprising:
a metal protective member disposed on the display unit; and
a conductive member connected to the metal protective member,
wherein the heat pad is grounded to the metal protective member through the conductive member.

13. The display device of claim 1, wherein the heat pad has a shape of one of a plurality of lines, a mesh, and as rectangle.

14. The display device of claim 1, wherein the heat pad is formed of metal or metal oxide.

15. The display device of claim 1, wherein the heat pad has a thickness in a range of 10 nm to 1,000 nm.

16. A display device, comprising:
a flexible substrate;
a display area disposed at the flexible substrate;
a gate-in-panel driver disposed over the flexible substrate and including a first thin film transistor portion, a second thin film transistor portion, and a clock line portion; and
a heat pad embedded in a side of the flexible substrate opposite to the gate-in-panel driver,
wherein the heat pad is disposed under the gate-in-panel driver to dissipate heat generated from the gate-in-panel driver, and overlaps at least one of the first thin film transistor portion, the second thin film transistor portion and the clock line portion, and does not overlap the display area to prevent a parasitic capacitance caused by electrical interference.

17. The display device of claim 16, further comprising:
a first protective member disposed over the flexible substrate; and
a conductive member electrically connected to the first protective member,
wherein the heat pad is grounded to the first protective member through the conductive member.

18. The display device of claim 16, wherein the flexible substrate has at least one groove in a surface of the flexible substrate facing opposite to the gate-in-panel driver,
wherein the heat pad is disposed in the at least one groove.

19. The display device of claim 18, further comprising a second protective member on the surface of the flexible substrate facing opposite to the gate-in-panel driver.

\* \* \* \* \*